United States Patent
Fix et al.

(10) Patent No.: US 8,148,631 B2
(45) Date of Patent: Apr. 3, 2012

(54) TRANSPARENT SUBSTRATE EQUIPPED WITH AN ELECTRODE

(75) Inventors: Renaud Fix, Paris (FR); Thibaud Heitz, Lyons (FR); Veronique Rondeau, Drancy (FR); Ulf Blieske, Monchengladbach (DE); Nikolas Janke, Herzogenrath (DE); Marcus Neander, Eschweiler (DE)

(73) Assignee: Saint-Gobain Glass France, Courbevoie (FR)

( * ) Notice: Subject to any disclaimer, the term of this patent is extended or adjusted under 35 U.S.C. 154(b) by 605 days.

(21) Appl. No.: 10/466,335

(22) PCT Filed: Jan. 23, 2002

(86) PCT No.: PCT/FR02/00274
§ 371 (c)(1),
(2), (4) Date: Mar. 2, 2004

(87) PCT Pub. No.: WO02/065554
PCT Pub. Date: Aug. 22, 2002

(65) Prior Publication Data
US 2004/0144419 A1    Jul. 29, 2004

(30) Foreign Application Priority Data
Jan. 31, 2001   (FR) ...................... 01 01292

(51) Int. Cl.
*H01L 31/00* (2006.01)
(52) U.S. Cl. ...................... 136/262; 136/252
(58) Field of Classification Search .................. 136/251
See application file for complete search history.

(56) References Cited

U.S. PATENT DOCUMENTS

| | | | | |
|---|---|---|---|---|
| 3,272,986 A | * | 9/1966 | Schmidt ...................... | 136/206 |
| 4,798,660 A | | 1/1989 | Ermer et al. ............. | 204/192.17 |
| 5,141,564 A | | 8/1992 | Chen et al. ................... | 136/258 |
| 5,356,839 A | | 10/1994 | Tuttle et al. .................. | 437/225 |
| 5,558,723 A | * | 9/1996 | Ufert ............................. | 136/244 |
| 5,626,688 A | * | 5/1997 | Probst et al. .................. | 136/265 |
| 5,871,630 A | | 2/1999 | Bhattacharya et al. ....... | 205/192 |
| 6,020,556 A | * | 2/2000 | Inaba et al. ................... | 136/256 |
| 6,825,409 B2 | * | 11/2004 | Haussler et al. .............. | 136/265 |
| 7,087,309 B2 | * | 8/2006 | Kriltz ............................ | 428/432 |
| 2001/0037823 A1 | * | 11/2001 | Middelman et al. .......... | 136/251 |

FOREIGN PATENT DOCUMENTS

| | | |
|---|---|---|
| JP | 05 063224 | 3/1993 |
| WO | WO 9513993 A1 * | 5/1995 |

OTHER PUBLICATIONS

J.H. Scofield A. Duda, D. Albin, B.L. Ballard and P.K. Predecki, "Sputtered molybdenum bilayer back contact for copper indium diselenide-based polycrystalline thin-film solar cells", Thin Solid Films 260 (1995) 26-31.*

M. Nishitani, T. Negami, N. Kohara, and T. Wada, Analysis of transient photocurrents in Cu(In,Ga)Se2 thin film solar cells, Oct. 1, 1997, J. Appl. Phys, 82, 7, 3572-3575.*

(Continued)

Primary Examiner — Alexa Neckel
Assistant Examiner — Miriam Berdichevsky
(74) Attorney, Agent, or Firm — Oblon, Spivak, McClelland, Maier & Neustadt, L.L.P.

(57) ABSTRACT

The subject of the invention is a transparent substrate, especially made of glass, which is provided with an electrode, especially for a solar cell, comprising a conductive layer based on molybdenum Mo with a thickness of at most 500 nm, especially at most 400 nm or at most 300 nm or at most 200 nm.

21 Claims, 1 Drawing Sheet glass/Si$_3$N$_4$/Cu(50 nm)/TiN(100 nm)/Mo(175nm)
nm

OTHER PUBLICATIONS

David F. Dawson-Elli et al., Substrate Influences on CIS Device Performance, Dec. 5-9, 1994, pp. 152-155.

J. Kessler et al., New World Record Cu(ln,Ga)Se$_2$, Based Mini-Module : 16.6 %, May 1-5, 2000, pp. 1-4.

* cited by examiner glass/ Si$_3$N$_4$(200 nm)/Mo (500nm)

glass/Si$_3$N$_4$/Cu(50 nm)/TiN(100 nm)/Mo(175nm)

TRANSPARENT SUBSTRATE EQUIPPED WITH AN ELECTRODE

FIELD OF THE INVENTION

The invention relates to a transparent substrate, especially made of glass, which is provided with an electrode. This conductive substrate is most particularly intended to form part of solar cells.

BACKGROUND OF THE INVENTION

It is known in fact that solar cells incorporate this type of conductive substrate, which is then coated with a layer of absorbent, generally made of chalcopyrite based on copper Cu, indium In and selenium Se and/or sulfur S. It may, for example be a material of the $CuInSe_2$ type. This type of material is known by the abbreviation CIS.

For this type of application, the electrodes are usually based on molybdenum Mo, as this material has a number of advantages: it is a good electrical conductor (relatively low specific resistance of about 5.2 mW.cm); it may be subjected to the necessary high heat treatments, as it has a high melting point (2,610° C.); and it exhibits good resistance, to a certain extent, to selenium and to sulfur. The deposition of the absorbent layer usually means that there must be contact with an atmosphere containing selenium or sulfur, which tends to cause most metals to deteriorate. In contrast, molybdenum reacts on the surface with selenium especially, forming $MoSe_2$. However, it keeps most of its properties, especially electrical properties, and maintains a suitable electrical contact with the CIS layer. Finally, molybdenum is a material which adheres well to the CIS layers—it even tends to promote their crystalline growth thereof.

However, it has a major drawback when considering industrial production—it is an expensive material. This is because the Mo layers are usually deposited by sputtering (enhanced by a magnetic field). Now, Mo targets are expensive. This is all the less negligible as, in order to obtain the desired level of electrical conductance (a resistance per square of less than 2, and preferably less than 1 or 0.5 ohms:square after treatment in an atmosphere containing S or Se), a thick Mo layer, generally of about 700 nm to 1 micrometer, is required.

SUMMARY OF THE INVENTION

The object of the invention is therefore to obtain a substrate provided with an electrode intended for solar cells, which is simpler to manufacture and/or less expensive than the known Mo electrodes, but whose performance, especially electrical performance, is equivalent or at the very least sufficient for the envisaged application.

DETAILED DESCRIPTION OF THE INVENTION

Figure 1:
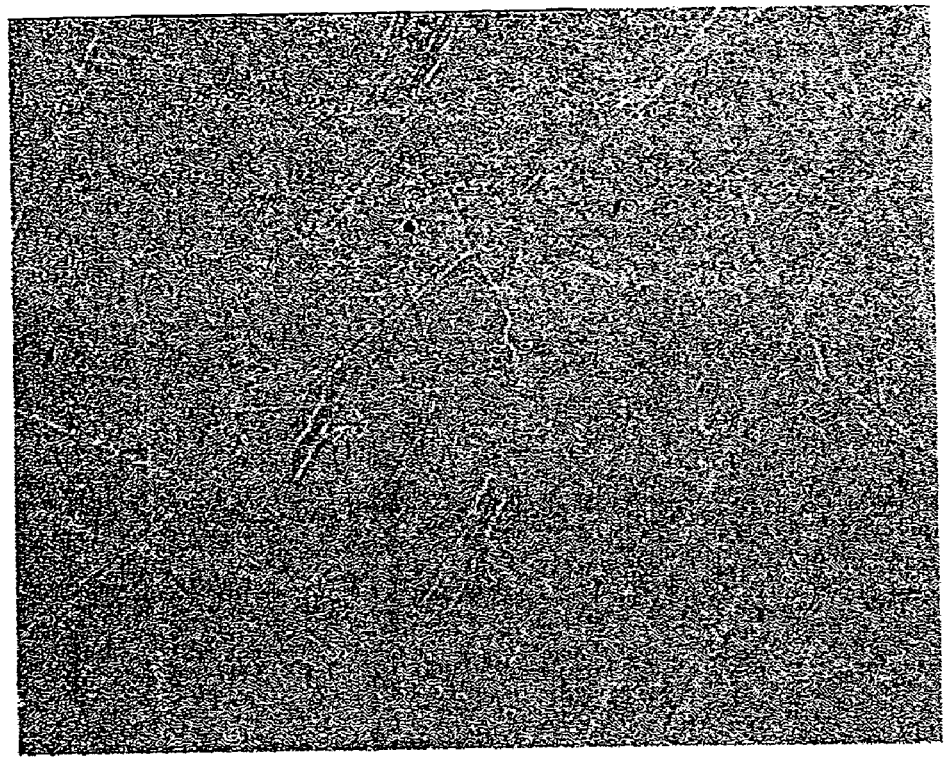
FIG. 1 is a ×1000 magnification micrograph of the multicolored coated glass substrate of Example 1.

The subject of the invention is firstly a transparent substrate, especially made of glass, which is provided with an electrode, especially one suitable for solar cells, and which comprises a conductive layer based on molybdenum Mo of at most 500 nm, especially at most 400 or at most 300 or at most 200 nm. Preferably, it has a thickness of at least 20 nm or at least 50 or 80 or 100 nm.

Within the context of the invention, the term "layer" is understood to mean either a continuous layer or a discontinuous layer having, in particular, patterns (either by etching of a continuous layer or by direct deposition of the discontinuous layer with the desired pattern, or by a mask system for example). This applies to all the layers involved in the present application.

The approach of the invention did not consist in completely eliminating molybdenum in favor of another metal, as no metal was deemed to be sufficiently resistant, especially when in contact with selenium or sulfur, and during the abovementioned heat treatments, without major degradation (the problem of possible degradation of the Mo has in the same way an impact on the absorbent layer which covers it). However, the approach has been to reduce significantly the molybdenum thickness: it has turned out, against all expectations, that thicknesses much less than those normally used—much less than 1 micrometer—are quite sufficient to obtain the desired electrical properties with, as a consequence, an appreciable saving in terms of raw materials cost. Decreasing the thickness of the molybdenum layer has another advantage: it has turned out that it is possible for these relatively thin layers to be deposited by sputtering with deposition parameters resulting in highly stressed layers without the problems of delamination that may arise in this particular case with thick layers. Thinner layers also tend to have fewer defects known as pinholes.

To ensure that thinner molybdenum layers maintain their effectiveness, the invention preferably lends itself to several variants (which remain, however, optional) used as alternatives or in combination.

According to a first variant, a layer called a barrier layer is advantageously inserted between the substrate and the electrode. Its main function is to form a barrier to the migration of diffusing species out of the substrate into the electrode and as far as the absorbent layer (and possibly, reciprocally, of diffusing species from the electrode into the substrate). When the substrate is made of glass, the species liable to diffuse out of the glass and degrade the electrode and the absorbent layer are especially alkali metals. By providing such a barrier layer, it is possible to use as substrate a standard silica-soda-lime glass obtained by the float process, without any risk of the electrode or the absorbent layer made of chalcopyrite deteriorating. Within the context of the invention, this is all the more important the thinner the molybdenum layer since any degradation even over a small thickness would have a greater impact than in the case of a much thicker layer.

Advantageously, this barrier layer is based on a dielectric material chosen from at least one of the following compounds: silicon nitride or oxynitride, aluminum nitride or oxynitride, silicon oxide or oxynitride. Silicon nitride (possibly containing a minority metal of the Al or boron type) has proved to be particularly effective. This is a very inert material, which is practically insensitive to the heat treatments and provides a satisfactory barrier to the diffusion of alkali metals.

Preferably, the barrier layer has a thickness of at least 20 nm, especially at least 100 or 120 or 150 nm, and a thickness of at most 300 nm, especially at most 250 or 200 nm.

According to a second variant, it may be desirable to "compensate" for the reduction in thickness of the Mo layer in order to obtain an electrode which, overall, is as conductive if not more conductive than a thick Mo layer. The solution according to the invention consists in adding, in the electrode, to the Mo-based layer at least one other conductive layer of a different kind. Advantageously, this "complementary" conductive layer(s) is(are) chosen to be made of materials which are less expensive to deposit (by sputtering) as a thin layer than molybdenum.

The complementary conductive layer, or the combination of the complementary conductive layers if there are several of them, preferably has a thickness of at least 10 nm, especially at least 40 nm. Preferably, it has a thickness of at most 300 nm and the thickness is advantageously chosen to be in a range from 50 to 200 or 300 nm.

According to a first embodiment of this second variant, the electrode comprises at least one complementary conductive layer called M based on a metal or an alloy of at least two metals. These may especially be the following metals or alloys: Cu, Ag, Al, Ta, Ni, Cr, NiCr, steel. It is advantageous to place this (these) complementary metal layer(s) beneath the molybdenum-based layer: in this configuration, the molybdenum layer isolates these metal layers from contact with selenium or sulfur, these elements being particularly corrosive and molybdenum being properly resistant to them.

According to a second embodiment of the second variant, as an alternative to or in conjunction with the first embodiment, the electrode comprises at least one complementary conductive layer called M'N based on a metal nitride. This may especially be a nitride of at least one of the following metals: Ta, Zr, Nb, Ti, Mo, Hf. This layer may be located beneath or above the molybdenum-based layer (or there may be two layers, one beneath said layer and the other above it). The nitride may be stoichiometric, substoichiometric or superstoichiometric in terms of nitrogen. The stoichiometry may be adjusted, especially by varying the percentage of nitrogen in the sputtering chamber when the layer is deposited by reactive sputtering using a metal target.

One particularly advantageous embodiment consists in combining the first two, by providing a layer M'N between a layer M and the Mo-based layer. This is because in this configuration the nitride layer M'N not only acts as a conductive layer but also as a layer preventing (or at the very least significantly reducing) any interdiffusion of species between the two metal layers (M and Mo). It has turned out that the TiN, TaN, ZrN, NbN and MoN layers were effective for preventing the diffusion of copper into the molybdenum layer. It has also been shown that HfN layers were particularly effective for preventing the diffusion of aluminum into the molybdenum layer (this type of formulation based on HfN, etc. does not prejudice the stoichiometry of the nitride—it may either be a substoichiometric or superstoichiometric nitride, as is the case for all the other nitride formulations mentioned in the present text).

It is possible to have, for example, configurations of electrodes according to the invention which comprise the following sequences of layers:

M/Mo/M'N
M/M'N/Mo
M/Mo
M'N/Mo
Mo/M'N.

If the layer of metal M is based on silver, it is preferable to ensure that it adheres well to the subjacent layer (for example the $Si_3N_4$-type barrier layer in one configuration, namely barrier layer/M layer/M'N layer/Mo layer), by inserting, between said barrier layer and said silver-based layer, a nucleation layer based on zinc oxide. It may also be beneficial, again to ensure better cohesion of the multilayer, to provide a second layer based on zinc oxide on top of the silver layer. The ZnO-based layer or layers, with the ZnO possibly being doped (with Al, B, etc.), are for example chosen to have a thickness of at least 5 nm, for example between 7 and 20 nm.

Preferably, the sum of the thicknesses of the conductive layers of the electrode is less than or equal to 600 nm, especially less than or equal to 500 or 400 nm.

Advantageously, the electrode has a resistance per square of less than or equal to 2 Ω/□, especially less than or equal to 1 Ω/□ and preferably less than or equal to 0.50 or 0.45 Ω/□: these values are appropriate for solar cell electrodes.

According to a preferred variant, the invention has aimed to improve the appearance of solar cells. This is because when a solar cell is fitted to the walls or roof of a building, its appearance on the "inside" of the building (on the outside, the electrode forms a mirror) is not always very attractive. The colorimetric response in reflection is susceptible to improvement.

A first solution to this subsidiary problem according to the invention consists in including the abovementioned barrier layer in a multilayer coating for optical purposes "beneath" the actual electrode. The optical coating consists of at least two layers of dielectric materials having different refractive indices. By varying the thicknesses and the index differences between the layers, the colorimetric response of the multilayer-coated substrate in reflection may thus be quite finely adjusted, by interference.

Preferably, this coating comprises an alternation of layers having a high index (1.9 to 2.3 for example) and layers having a low index (1.4 to 1.7 for example). Embodiments of this coating are, for example, $Si_3N_4/SiO_2$ or $Si_3N_4/SiO_2/Si_3N_4$.

A second solution, as an alternative to or in conjunction with the first, consists in using electrodes containing at least one layer based on a nitride M'N and in modifying, slightly, the nitrogen stoichiometry. This is because it has been found that slightly substoichiometric or superstoicheomtric nitrides retain the same electrical properties but allow the calorimetric response of the substrate to be varied to a certain degree. By combining the two solutions, the number of options in adjusting the calorimetric response is increased.

A third solution, as an alternative or in conjunction with at least one of the first two solutions, consists in placing a thin layer absorbent in the visible beneath the electrode, especially by interposing it between the barrier layer and the electrode. For example, these may be layers of a metal nitride, of the TiN type, and they preferably have a thickness lying within the range from 2 to 15 nm. It is thus possible to have a sequence of layers of the type: glass/barrier layer, such as $Si_3N_4$/thin absorbent layer, such as TiN/$SiO_2$/Mo—in this case, the absorbent layer lies "in the middle" of the $Si_3N_4/SiO_2$ optical coating.

It is thus possible to obtain a substrate provided with this coating and with the electrode which, in reflection, has negative a* and b* values in the (L,a*,b*) colorimetry system, which corresponds to colors in the blue-greens, or a slightly positive a* value and a negative b* value, which corresponds to a color in the pinks.

The subject of the invention is also the substrate defined above and coated, on top of the electrode, with a layer of chalcopyrite absorbent.

The subject of the invention is also said substrate for making solar cells.

The invention will now be explained in detail with the aid of nonlimiting examples of embodiments of electrodes for solar cells, illustrated in FIGS. 1 and 2 by micrographs of the multilayer-coated glass substrates.

Each example uses a clear silica-soda-lime glass substrate 2 mm in thickness (the glass substrates generally have a thickness of between 1 and 4 or between 1 and 3 mm).

All the layers were deposited on the glass substrates by magnetic-field-enhanced sputtering:

the metal layers using a target of the corresponding metal, in an inert atmosphere;

the metal nitride layers using a target of the corresponding metal, in a reactive atmosphere containing a mixture of inert gas and nitrogen;

the silicon nitride layers using an Al-doped Si target, in a reactive atmosphere containing a mixture of inert gas and nitrogen; and the silicon oxide layers using an Al-doped Si target and a reactive atmosphere comprising a mixture of inert gas and oxygen.

The layers were tested in the following manner:

① —measurement of the resistance per square R□(1) by the four-point method after all the layers have been deposited;

② —the so-called "bronze" test: this test consists in heating the glass provided with all the layers at 350° C. for 10 minutes in air. The test is intended to check whether or not sodium has diffused from the glass into the electrode. At the end of the test, the resistance per square, R/□ (2), is measured, again by the four-point method. In addition, a microscope was used (at ×100 and ×1000 magnifications) to check whether or not the heat treatment has caused defects (pinholes), etc.;

③ the so-called "selenization" test: this test consists in again heating the glass substrates provided with all the layers in a selenium atmosphere for 10 minutes. The selenium temperature is between 200 and 240° C. and the glass temperature between 325 and 365° C. At the end of the test, the resistance per square, R/□(3), is again measured and from this is alculated the difference in resistance per square, ΔR□(3), between the value before selenization and the value after selenization.

It should be noted that this selenization test is in fact much "harder" than in reality. This is because the invention here pertains firstly only to the manufacture of the electrodes. However, when the solar cell in its entirety is manufactured, this selenization step takes place once the CIS layer has been deposited: in the normal manufacturing cycle for a solar cell, the electrode is "protected" from direct contact with selenium by the chalcopyrite layer.

For the electrodes to be regarded as being satisfactory, it is deemed advantageous:

for the sodium in the glass to be prevented from diffusing into the electrode;

for the electrode to have a certain resistance to the "bronze test" and to the "selenization" test, namely few defects and sufficient resistance per square;

for the electrode to adhere well to the CIS layers; and for the electrode to be easily etchable, especially by a laser.

EXAMPLES 1 TO 7

Example 1

This example uses a barrier layer and a molybdenum monolayer electrode, in the sequence:

glass/$Si_3N_4$ (200 nm)/Mo(500 nm).

FIG. 1 is a ×1000 magnification in a microscope of the glass after the selenization step. The micrograph shows that there are few defects, which are also small. It is considered that the quality of the electrode is good.

Example 1a

This example uses the same multilayer stack as in example 1, but with a markedly thinner Mo layer, in the sequence:

glass/$Si_3N_4$ (200 nm) /Mo 200 nm)

Example 2

This example uses a barrier layer and a bilayer electrode, namely a layer of metal M then a layer of Mo, in the following sequence:

glass/$Si_3N_4$(200 nm)/Ag(50 nm)/Mo(175 nm)

Example 3

This example uses the same configuration as in example 2, but with another type of layer of metal M:

glass/$Si_3N_4$(200 nm)/Al(100 nm)/Mo(175 nm).

Example 4

This example uses a barrier layer and a metal/metal nitride/Mo trilayer electrode in the sequence:

glass/$Si_3N_4$(200 nm)/Cu(100 nm)/TiN (100 nm)/Mo(175 nm)

Example 5

This is the same configuration as example 4, but with a different thickness for the copper layer:

glass/$Si_3N_4$(200 nm)/Cu(50 nm)/TiN(100 nm)/Mo(175 nm).

Figure 2:
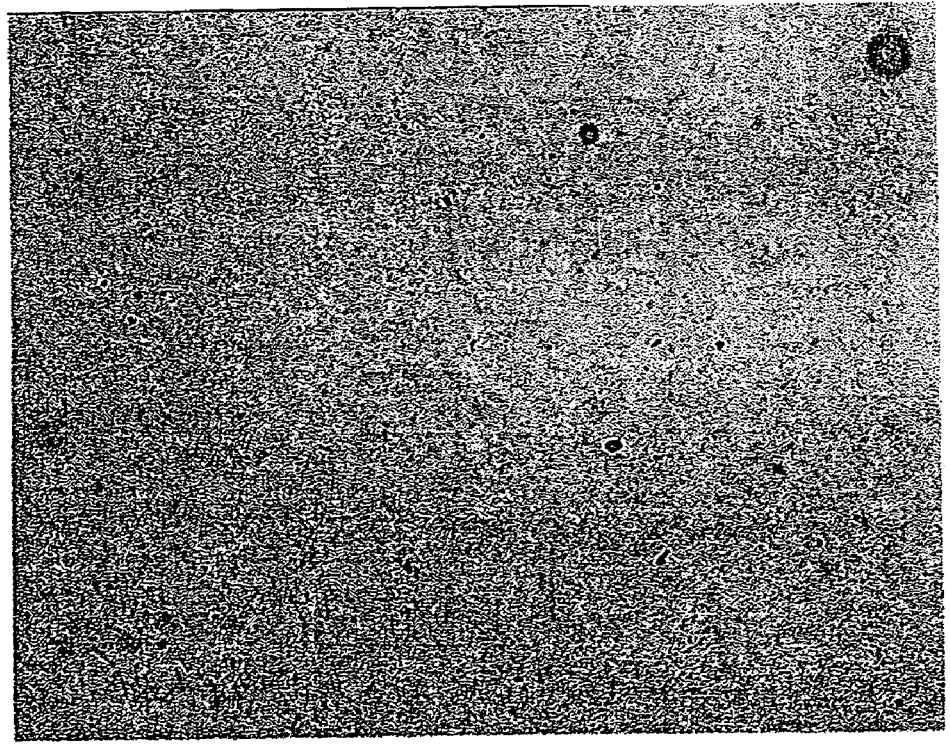
FIG. 2 is a ×1000 magnification micrograph of the multicolored coated glass substrate of Example 5.

FIG. 2 corresponds to a micrograph at ×1000 magnification of this example 5 for a portion of the multilayer-coated glass after the selenization test: few defects may be seen, and these are very small. This micrograph is quite comparable to that in FIG. 1.

Example 6

This example uses a barrier layer and a trilayer electrode, in the following sequence:

glass/$Si_3N_4$(200 nm)/Ag(50 nm)/TiN(100 nm)/Mo(175 nm).

It corresponds to example 2, but with in addition a TiN layer.

Example 7

This example again uses a barrier layer and a trilayer electrode, in the following sequence:

glass/$Si_3N_4$(200 nm)/Al(100 nm)/TiN(100 nm)/Mo(175 nm)

It corresponds to example 3, but with in addition a TiN layer.

Table 1 below gives, for each of examples 1 to 7, the values of R□ (1) and R□ (2), the number of defects after the bronze test ("defects") and the value of ΔR□ (3), these terms having been explained above.

TABLE 1

| EXAMPLES | R□ (1) | R□ (2) | DEFECTS | ΔR□ (3) |
|---|---|---|---|---|
| Ex. 1 $Si_3N_4$/Mo | 0.37 | 0.37 | None | 0 to −5% |
| Ex. 1a $Si_3N_4$/Mo | 0.98 | 0.96 | None | 0 to −3% |
| Ex. 2 $Si_3N_4$/Ag/Mo | 0.42 | 0.42 | None | −17% |
| Ex. 3 $Si_3N_4$/Al/Mo | 0.36 | 0.34 | None | — |
| Ex. 4 $Si_3N_4$/Cu/TiN/Mo | 0.45 | 0.45 | None | −9% |
| Ex. 5 $Si_3N_4$/Cu/TiN/Mo | 0.44 | 0.44 | None | −10% |
| Ex. 6 $Si_3N_4$/Ag/TiN/Mo | 0.44 | 0.44 | None | −12% |
| Ex. 7 $Si_3N_4$/Al/TiN/Mo | 0.38 | 0.36 | None | — |

The following conclusions may be drawn from this data:

An R☐ value markedly less than 1 ohm/square may be obtained with less than 200 nm of molybdenum, which is associated with a layer of metal nitride and/or of metal having reasonable thicknesses (in total, the bilayer or trilayer electrodes have an overall thickness of less than 400 or 500 nm).

The $Si_3N_4$ barrier layers are effective and prevent the electrode from deteriorating by sodium diffusion, since in all the examples the R☐ (1) and R☐ (2) values are the same or almost the same. They therefore also prevent the CIS absorbent layer from deteriorating.

It is also possible to choose to have an Mo monolayer electrode (example 1: 500 nm combined with a barrier layer). It gives good results. It is even possible to have a resistance per square of less than 1 ohm. square with an electrode composed of only 200 nm of Mo. This proves that it is unnecessary to have a much thicker Mo layer, as believed to be the case hitherto.

EXAMPLES 8 TO 11B

The purpose of these examples is to adjust the colorimetric response of the electrode in reflection.

The molybdenum layer in all these examples has a thickness of 400 nm or 500 nm. From the standpoint of colorimetric response on the glass side, the molybdenum layer has no effect beyond a thickness of at least 50 to 100 nm, since it is then a perfectly opaque mirror layer: the results would be the same with an Mo layer of 175 or 200 nm.

Example 8

This example uses the following multilayer stack:
glass/$Si_3N_4$(200 nm)/TiN(100 nm)/Mo(400 nm)
the TiN layer being deposited by reactive sputtering in a reactive atmosphere containing 20% nitrogen by volume.

Example 8a

This is the same configuration as in example 8, but in this case the TiN layer was deposited in an atmosphere containing 40% nitrogen.

Example 8b

This is the same configuration as in example 8, but in this case the TiN layer was deposited in an atmosphere containing 70% nitrogen.

The table below gives, for these three examples, values of a* and b* in the (L,a*,b*) colorimetry system, the values being measured on the glass side, and the R☐ values (measurements made before the "bronze" test).

| EXAMPLES | A* | b* | R☐ (ohm.square) |
|---|---|---|---|
| Ex. 8 | −8.6 | 19.4 | 0.44 |
| Ex. 8a | −9.2 | 1.5 | 0.38 |
| Ex. 8b | −11.6 | −3.6 | 0.35 |

It may be seen that the variation in TiN stoichiometry (which depends on the amount of $N_2$ during the deposition) does not significantly modify the electrical properties of the electrode. On the other hand, it does allow great modifications in the value of a* and, even more, the value of b*—example 8 is thus colored in the reds with a very positive b*, whereas example 8c is in the blue-greens, with a slightly negative b*.

Example 8 has a slightly substoichiometric TiN layer, example 8a has an approximately stoichiometric TiN layer, while example 8c has a tendency to be superstoichiometric in terms of nitrogen.

Example 9

In this example, the $Si_3N_4$ barrier layer (with a refractive index of about 2) is combined with an additional layer based on $SiO_2$ (with a refractive index of about 1.45) in order to make a high-index/low-index optical coating.

The configuration is as follows:
glass/$Si_3N_4$(200 nm)/$SiO_2$(20 nm)/TiN(100 nm)/Mo(400 nm).

The TiN layer was deposited in an atmosphere containing 20% nitrogen by volume.

Example 9a

Example 9 was repeated, but this time with 40% nitrogen in the TiN deposition atmosphere.

Example 9b

Example 9 was repeated, but this time with 70% nitrogen in the TiN deposition atmosphere.

The table below gives, for these 3 examples, the a*, b* and Rsquare values explained above.

| EXAMPLES | a* | b* | R☐ (ohm.square) |
|---|---|---|---|
| Ex. 9 | −8.1 | 22.5 | 0.34 |
| Ex. 9a | −10.6 | −8.3 | 0.38 |
| Ex. 9b | −14.0 | 5.5 | 0.35 |

Example 10

This time, the nitride layer used was made of NbN, in the following configuration:
glass/$Si_3N_4$(200 nm) /$SiO_2$ (30 nm/NbN(100 nm)/Mo(500 nm)

The NbN layer was deposited in an atmosphere containing 20% nitrogen.

Example 10a

Example 10 was repeated, but in this case the NbN layer was deposited in an atmosphere containing 40% nitrogen.

Example 10b

Example 10 was repeated, but in this case the NbN layer was deposited in an atmosphere containing 70% nitrogen. The table below gives, for these three examples, the a*, b* and Rsquare values already explained:

| EXAMPLES | a* | b* | R☐ (ohm/square) |
|---|---|---|---|
| Ex. 10 | −14 | −0.5 | 0.29 |
| Ex. 10a | −10.6 | −9.2 | 0.37 |
| Ex. 10b | −17.6 | −0.9 | 0.42 |

In this case, although the NbN is more substoichiometric or superstoichiometric, the a* and b* values are negative, which corresponds to an attractive blue-green color whose intensity varies.

Example 11

This example repeats the sequence of layers of examples 10, 10a, 10b, but with different $Si_3N_4$ and $SiO_2$ thicknesses. The configuration is as follows:

glass/$Si_3N_4$(150 nm)/$SiO_2$(90 nm)/NbN(100 nm)/Mo(500 nm).

Example 11a

This example repeats example 11, but in this case the NbN layer was deposited in an atmosphere containing 40% nitrogen.

Example 11b

This example repeats example 11, but in this case the NbN layer was deposited in an atmosphere containing 70% nitrogen.

The table below gives, for these three examples, the a*, b* and R square values already explained:

| EXAMPLES | a* | b* | R□ (ohm/square) |
|---|---|---|---|
| Ex. 11 | 0.3 | −7.6 | 0.34 |
| Ex. 11a | 2.8 | −10.3 | 0.33 |
| Ex. 11b | 8.8 | −14.2 | 0.28 |

These examples are therefore in the pinks, this color also being deemed to be attractive.

Example 12

This example has the following sequence of layers:
glass/$Si_3N_4$(150 nm)/$SiO_2$(65 nm)/$Si_3N_4$(15 nm)/Mo(500 nm).

It therefore incorporates the barrier layer in a high-index/low-index/high-index three-layer optical coating.

The table below gives the same data for this example as in the previous examples.

| EXAMPLES | a* | b* | R□ (ohm/square) |
|---|---|---|---|
| Ex. 12 | −4.1 | −6.3 | 0.28 |

This example therefore has a color in the blue-greens, also of low intensity.

In conclusion, the color of the electrodes according to the invention can therefore be finely adjusted by varying the stoichiometry of the nitride layer and/or by adding a filter to at least two layers advantageously including the barrier layer. Moreover, it has been confirmed that the a* and b* values of this second series of examples vary little (by less than ±2) once the "bronze" test has been passed.

The invention claimed is:

1. A substrate, comprising:
   (i) a base,
   (ii) an electrode consisting of a conductive layer of molybdenum having a thickness of at least 20 nm and at most 500 nm, and
   (iii) a barrier layer provided between the base and the electrode to reduce diffusion of alkali metals,
   wherein a resistance per square, R□, of the electrode is less than or equal to 2 Ω/□.

2. The substrate of claim 1, further comprising an absorbent layer which comprises chalcopyrite.

3. The substrate of claim 1, wherein the base is glass.

4. The substrate of claim 1, wherein the thickness of the molybdenum layer is at least 50 nm.

5. The substrate of claim 1, wherein the thickness of the molybdenum layer is at least 100 nm.

6. The substrate of claim 1, wherein the thickness of the molybdenum layer is at least 80 nm.

7. The substrate of claim 1, wherein the barrier layer is a dielectric material selected from the group consisting of silicon nitride, silicon oxynitride, aluminum nitride, aluminum oxynitride, silicon oxide, and silicon oxycarbide.

8. The substrate of claim 1, wherein the barrier layer has a thickness ranging from 20 nm to 300 nm.

9. The substrate of claim 7, wherein the barrier layer has a thickness ranging from 100 nm to 200 nm.

10. The substrate of claim 1, wherein the electrode has a resistance per square, R□, of less than or equal to 1 Ω/□.

11. The substrate of claim 10, wherein the electrode has a resistance per square, R□, of less than or equal to 0.45 Ω/□.

12. The substrate of claim 1, wherein the barrier layer is a multilayer coating comprising at least two layers of dielectric material that have different refractive indices.

13. The substrate of claim 12, wherein the barrier layer comprises a first dielectric material having a refractive index ranging from 1.9 to 2.3 and a second dielectric material having a refractive index ranging from 1.4 to 1.7.

14. The substrate of claim 13, wherein the barrier layer comprises a first dielectric material and the second dielectric material in the sequence $Si_3N_4$/$SiO_2$ or $Si_3N_4$/$SiO_2$/$Si_3N_4$.

15. The substrate of claim 13, wherein the substrate has a negative a* value and a negative b* value or a positive a* value and a negative b* value.

16. The substrate of claim 12, wherein the substrate has a negative a* value and a negative b* value or a positive a* value and a negative b* value.

17. The substrate of claim 1, further comprising a layer of TiN having a thickness ranging from 2 nm to 15 nm disposed between the barrier layer and the electrode and the substrate has a negative a* value and a negative b* value or a positive a* value and a negative b* value.

18. A solar cell comprising the substrate of claim 1.

19. The substrate of claim 1, wherein the electrode is reflective.

20. The substrate of claim 1, wherein the thickness of the molybdenum layer is at least 200 nm.

21. A method comprising:
   providing a base,
   providing an electrode consisting of a conductive layer of molybdenum having a thickness of at least 20 nm and at most 500 nm,
   providing a barrier layer between the base and the electrode to reduce diffusion of alkali metals,
   heating the base, electrode, and the barrier layer in a selenium atmosphere, and
   wherein the resistance per square of the electrode remains less than or equal to 2 Ω/□ after the heating step.

* * * * *

UNITED STATES PATENT AND TRADEMARK OFFICE
CERTIFICATE OF CORRECTION

| | | |
|---|---|---|
| PATENT NO. | : 8,148,631 B2 | Page 1 of 1 |
| APPLICATION NO. | : 10/466335 | |
| DATED | : April 3, 2012 | |
| INVENTOR(S) | : Renaud Fix et al. | |

It is certified that error appears in the above-identified patent and that said Letters Patent is hereby corrected as shown below:

Column 5, line 22, change "alculated" to --calculated--.

Signed and Sealed this
Seventeenth Day of July, 2012

David J. Kappos
*Director of the United States Patent and Trademark Office*